United States Patent

Kudo et al.

[11] Patent Number: 5,302,933
[45] Date of Patent: Apr. 12, 1994

[54] INFRARED SENSOR

[75] Inventors: Takeshi Kudo; Takehisa Mori; Kiyoshi Komatsu, all of Kanagawa, Japan

[73] Assignee: Terumo Kabushiki Kaisha, Tokyo, Japan

[21] Appl. No.: 950,085

[22] Filed: Sep. 22, 1992

[30] Foreign Application Priority Data

Sep. 27, 1991 [JP] Japan .................. 3-249027

[51] Int. Cl.$^5$ .......................................... H01L 31/08
[52] U.S. Cl. ........................... 338/18; 338/25; 338/306
[58] Field of Search ............... 338/18, 25, 22 R, 306, 338/307, 308, 309

[56] References Cited

U.S. PATENT DOCUMENTS 4,574,263  3/1986  Liddiard .................. 338/18
5,097,841  3/1992  Moriuchi et al.

FOREIGN PATENT DOCUMENTS

0360286   3/1990  European Pat. Off.
56-164582 12/1981  Japan .
57-178149 11/1982  Japan .
60-80281   5/1985  Japan .
60-97676   5/1985  Japan .
62-277528  2/1987  Japan .
2-138841   5/1990  Japan .
2-167441   6/1990  Japan .
2-237166   9/1990  Japan .
2-240971   9/1990  Japan .

*Primary Examiner*—Marvin M. Lateef
*Attorney, Agent, or Firm*—Frishauf, Holtz, Goodman & Woodward

[57] ABSTRACT

An infrared radiation sensor has a bridge portion which bridges a cave portion formed in a sensor substrate. The bridge portion includes an infrared radiation receiving portion and support portions for supporting the infrared radiation receiving portion. The plane shape of the infrared radiation receiving portion is a square or a circle which has a greater side length or a greater diameter than the width of the supporting portions to increase the amount of infrared radiation received by the infrared receiving portion.

19 Claims, 6 Drawing Sheets

INFRARED SENSOR

BACKGROUND OF THE INVENTION

1. Field of The Invention

The present invention relates generally to an infrared radiation sensor for measuring the temperature of a subject, such as a tympanic membrane, without contact therewith. More specifically, the invention relates to an infrared radiation sensor having a bridge structure on which a thermally sensitive portion is formed.

2. Description of The Background Art

In thermal type infrared radiation sensors, the temperature of a substance is measured on the basis of the temperature increase of a thermally sensitive portion which is heated by infrared radiation radiated from the substance. Various technologies for making the sensors compact and highly-sensitive have been proposed. In particular, when the temperature of a substance is substantially equal to or less than room temperature, the amount of infrared radiation received by the sensor is very small. Therefore, it is necessary to decrease the heat capacity of the sensor and to prevent the energy of the received infrared radiation from being scattered and lost as much as possible.

In recent years, various infrared radiation sensors reduced in size to decrease their heat capacity and having a bridge structure to prevent heat from being scattered and lost due to conduction of heat, have been proposed (JP-A 57-178149, 62-277528 and JP-A 3-136379). These sensors are designed to decrease heat capacity by compacting using semiconductor fine patterning or micromachining, and they have a thermally sensitive portion on a bridge structure which does not make contact with a substrate in order to prevent heat from being scattered and lost due to conduction of heat.

The infrared radiation sensors disclosed in JP-A 57-178149 and JP-A 62-277528 are obtained by forming on a silicon substrate or a metallic substrate an insulating film of a laminated film consisting of a silicon oxide film (SiOx) and a silicon nitride film (SiNy), transcribing a pattern of a bridge portion on the insulating film by a photolithographic technique, forming and patterning a predetermined wiring and thermally sensitive portion on the insulating film which has not been etched, and selectively etching a part of the substrate to form a caved portion. These methods are referred to as "anisotropic etching" or "isotropic etching" in accordance with a manner for selectively etching a part of the substrate.

The infrared radiation sensor disclosed in JP-A 3-136379 is obtained by accurately forming a caved portion which is to be arranged below a bridge portion, on a substrate at a predetermined region prior to the formation of the bridge portion; filling in the caved portion with a metallic film which serves as a sacrificial layer for forming the bridge portion, to make the surface of the substrate even; forming on the whole even surface an insulating film of laminated film of a silicon oxide film and a silicon nitride film, or an insulating film of an organic material; forming a pattern of a bridge on the insulating film by photolithography and etching; patterning metallic wirings and a thermally sensitive portion; and selectively etching only the sacrificed layer.

However, since these conventional infrared radiation sensors are provided to improve the yield of t he formation of a bridge portion, the dimensional accuracy thereof, the uniformity of thermal characteristics of each sensor element and the accuracy of temperature measurement, they are not designed to increase the amount of received infrared radiation to improve the sensitivity of the sensor.

For that reason, these infrared radiation sensors can not achieve fully high-sensitive measurement of temperature since the shape of the bridge portion is not designed to be optimized in view of the amount of received infrared radiation energy and the amount of energy lost due to heat conduction of the bridge portion in order to increase the temperature increase of the thermally sensitive portion on the bridge portion.

SUMMARY OF THE INVENTION

It is the re fore a principal object of the present invention to eliminate the aforementioned disadvantages and to provide an improved infrared radiation sensor.

It is another object of the present invention to provide an infrared radiation sensor which can increase the temperature increase of a thermally sensitive portion to achieve high-sensitive measurement of the temperature of a subject.

It is another object of the present invention to provide an infrared radiation sensor which can increase the temperature increase of a thermally sensitive portion by optimizing the shape of a bridge portion on which the thermally sensitive portion is formed.

In order to accomplish, the aforementioned and other objects, an infrared radiation sensor has a bridge portion formed on a sensor substrate having a cave portion, the bridge portion comprising a supporting portion and an infrared radiation receiving portion which is wider than the width of the supporting portion. The shape of the bridge Portion may be selectively determined on the basis of a relationship between the temperature increase of a thermally sensitive portion formed on the bridge portion and the manufacturing yield of the sensor.

According to one aspect of the present invention, an infrared radiation sensor comprises: a sensor substrate having a cave portion; a bridge portion formed on a surface of the sensor substrate so as to bridge the cave portion the bridge portion comprising an infrared radiation receiving portions ,for supporting the infrared radiation receiving portion, the infrared radiation receiving portion having a greater width than that of the supporting portions; and a thermally sensitive portion formed on the infrared radiation receiving portion, the thermally sensitive portion having characteristics in which electrical resistance varies in accordance with the temperature of the infrared radiation receiving portion.

The infrared radiation receiving portion may be integrally formed with the supporting portions. Although the plane shape of the infrared radiation receiving portion may be optionally selected, it is preferably a square to facilitate the manufacturing of the sensor. The center of the infrared radiation receiving portion is preferably arranged at the center of the bridge portion. The ratio of a side length of the infrared radiation portion to the whole length of the bridge portion may be in the range of 0.1 to 0.9, preferably in the range of 0.2 to 0.6. The plane shape of the infrared radiation receiving portion may also be a circle. In this case, the ratio of the diameter of the infrared radiation receiving portion to the whole length of the bridge portion may be in the range of 0.1 to 0.9, preferably in the range of 0.2 to 0.6.

Although the number of the supporting portions may be optionally selected, it is preferably two or four since the quantity of heat lost due to heat conduction increases as the number increases.

The sensor substrate may be a semiconductor substrate of silicon or germanium, although it is preferably a silicon substrate which is easily and cheaply available. The thermally sensitive portion may be formed of a film selected from the group consisting of amorphous germanium (a-Ge), amorphous silicon (a-Si) and polycrystalline silicon films. The thermally sensitive portion may be formed by sputtering, ion-beam sputtering, CVD (chemical vapor deposition) method or the like.

The bridge portion may be formed of a material selected from t he group consisting of dielectric materials, such as a silicon oxide film (SiOx), a silicon nitride film (SiNy), a laminated film thereof and a silicon oxynitride film (SiOxNy); synthetic resins, such as polyimides and photoresists; semiconductor materials, such as monocrystalline silicons and polycrystalline silicons; and a thin metallic film. It is preferably formed of a silicon oxynitride film (SiOxNy) which has both characteristics of a silicon oxide film and a silicon nitride film, and which has a good stress balance to allow the formation of a stable bridge structure. The optimum condition of the formation o f the silicon oxynitride film varies in accordance with the kind of sensor substrate to be used, since the thermal expansion coefficient varies in accordance with the plane orientation of the substrate material.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Figure 1:
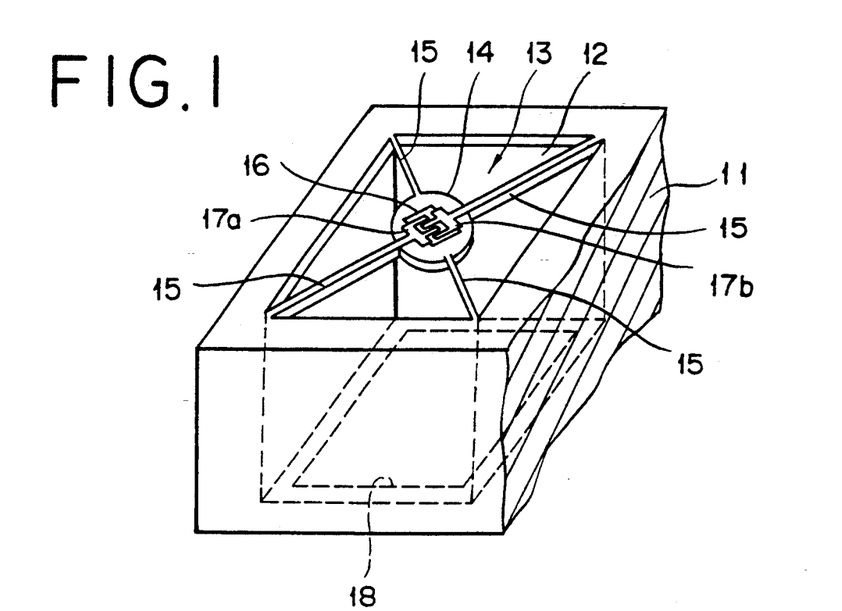
FIG. 1 is a perspective view of the preferred embodiment of an infrared radiation sensor, according to the present invention.
Figure 2:
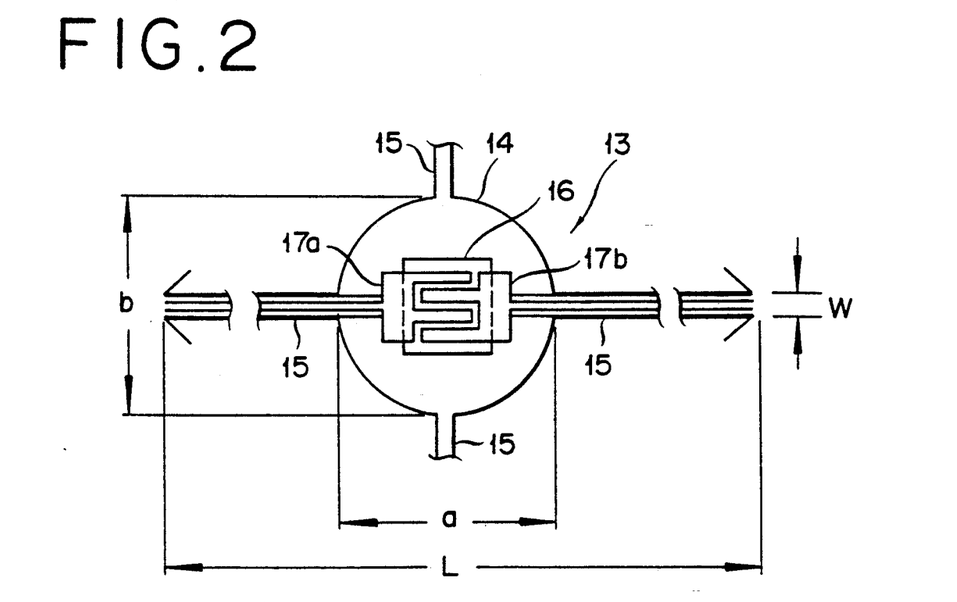
FIG. 2 is an enlarged view of a bridge portion of the infrared radiation sensor of FIG. 1.

Referring now to the drawings, particularly FIGS. 1 and 2, the preferred embodiment of an infrared radiation sensor of the present invention will be described below.

As shown in FIG. 1, an infrared radiation sensor, according to the present invention, comprises a silicon substrate 11 (300 to 400 μm in thickness) serving as a sensor substrate and having a caved portion 12, and a bridge portion 13 which is formed on a surface of the silicon substrate 11 so as to bridge the caved portion 12. The bridge portion 13 comprises a circular infrared radiation receiving portion 14 and four supporting portions 15 for supporting the infrared radiation receiving portion 14. Both of the infrared radiation receiving portion 14 and the supporting portions 15 are integrally formed of silicon oxynitride film having a thickness of 3 μm. A thermally sensitive portion 16 is formed on the infrared receiving portion 14 at the center thereof. The thermally sensitive portion 16 is formed of a material having electrical resistance which varies in accordance with the variation of temperature thereof (thermistor effect), for example, amorphous germanium (a-Ge). The thermally sensitive portion 16 is connected to a measuring system (not shown) via comb-shaped wiring layers 17a and 17b of a metal, such as aluminum.

An infrared radiation guiding aperture 18 is formed in the silicon substrate 11 on the reverse side thereof opposite to the infrared radiation receiving portion 14. Infrared radiation radiated radiation from a subject passes through the infrared guiding aperture 18 to be received by the infrared radiation receiving portion 14. The infrared radiation received by the infrared radiation receiving portion 14 is transmitted to the thermally sensitive portion 16 to cause the variation of the electrical resistance value thereof. The electrical resistance value of the thermally sensitive portion 16 is detected by measuring the electrical current or voltage value of the measuring system connected to the wirings 17a and 17b via electrode pads which are provided on the ends of the wirings 17a and 17b. On the basis of this current or voltage value, the amount of infrared radiation radiated from the subject, i.e. the temperature thereof, can be determined.

According to the present invention, the infrared radiation sensor can receive a greater amount of infrared radiation, since the infrared radiation receiving portion 14 is wider than the supporting portions 15 so as to increase the area for receiving light. Therefore, the temperature of the thermally sensitive portion 16 can be effectively increased, so that the sensitivity of the sensor can be improved.

Although the shape of the infrared radiation receiving portion 14 is a circle in the illustrated embodiment, it should not be limited to a circle. According to t he present invention, it be selected from various shapes if the infrared radiation receiving portion 14 is wider than that of the supporting portions 15. As the width of the supporting portions 15 decreases, the quantity of heat which gets scattered and lost from this portion decreases. At this point, it is preferable to make the width of the supporting portions 15 thin, as long as a desired mechanical strength thereof is maintained.

In order to decrease heat loss due to conduction of heat, the thickness of the infrared radiation receiving portion 14 and the supporting portions 15 is preferably thin (for example, not more than 18 μm). According to the present invention, it may decrease to about 3 μm since the infrared radiation receiving portion 14 and the supporting portions 15 are formed of a silicon oxynitride film having a superior strength.

A process for manufacturing an infrared radiation sensor, according to the present invention, will be described below.

Figure 3A:
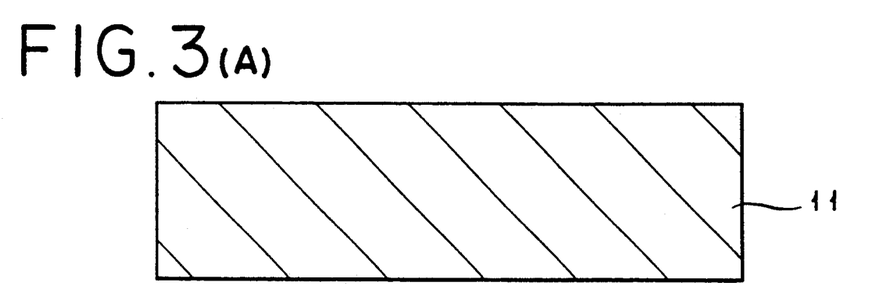
FIGS. 3(A) to 3(I) are sectional views illustrating a process for manufacturing the infrared radiation sensor of FIG. 1.
Figure 3B:
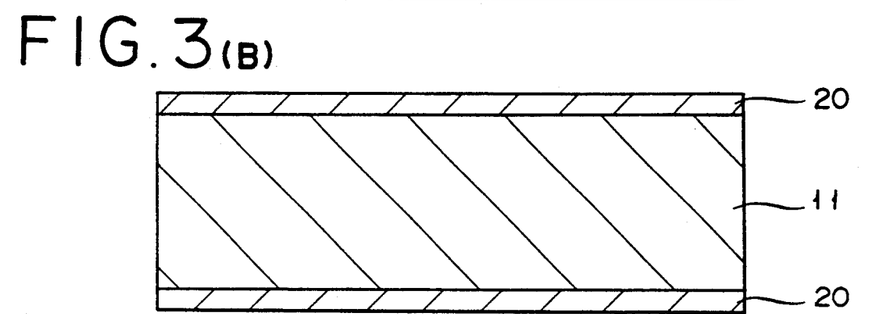

First, a silicon substrate 11 having a crystalline plane orientation (100) as shown in FIG. 3(A) was prepared. Then, a silicon oxynitride film (SiOxNy) 20 of 1 μm in thickness was formed on both surfaces of the silicon substrate 11 by plasma CVD method as shown in FIG. 3(B). That is, the silicon substrate 11 was heated to 500°

C. to cause the vapor phase growth of the silicon oxynitride on both surfaces of the silicon substrate under a film forming condition which maintains a pressure of 0.45Torr and a high-frequency output of 400W, using as reaction gases 10SCCM of monosilane (SiH$_4$), 207SCCM of nitrogen (N$_2$) and 28SCCM of nitrous oxide gas (N$_2$O).

Figure 3C:
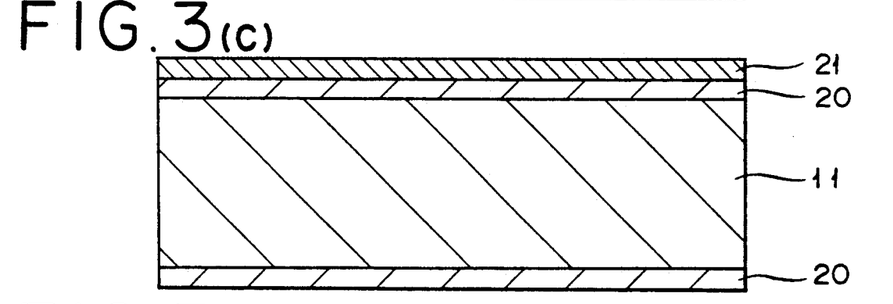

Then, the sputtering was carried out using germanium as a target to deposit an amorphous germanium (a-Ge) film 21 on the silicon oxynitride film 20 on the surface of the silicon substrate 11 as shown in FIG. 3(C). The sputtering was carried out for 10 minutes at a gas flow rate of argon (Ar)=2SCCM, under a film forming pressure of $3\times10^{-3}$Torr at a high-frequency output of 200W. Then, annealing was carried out to promote the polycrystallization of amorphous germanium.

Figure 3D:
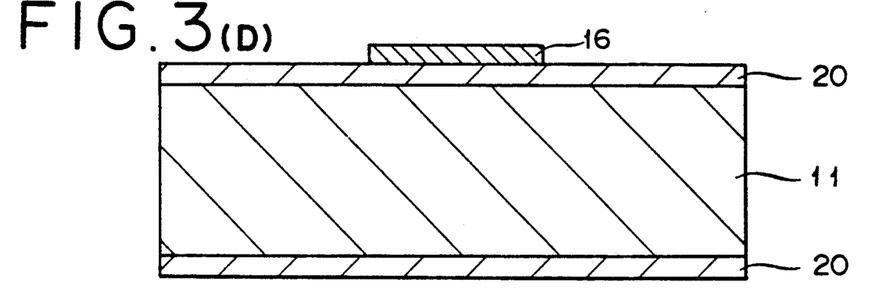

Subsequently, the polycrystallized amorphous germanium film 21 was patterned by reactive ion etching (RIE) to form a thermally sensitive portion 16 as shown in FIG. 3(D). The reactive ion etching was carried out using as etching gases fleon (CF$_4$) and oxygen (O$_2$), at gas flow rates of CF$_4$=38SCCM and O$_2$=2SCCM under an etching pressure of 0.2Torr at a high-frequency output of 150W for an etching time of 10 minutes.

Figure 3E:
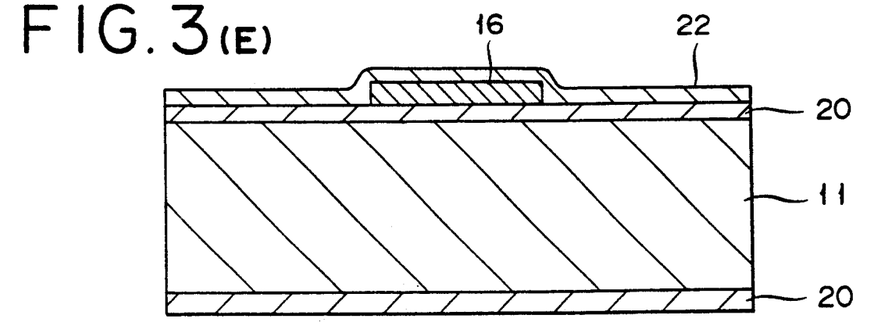
Figure 3F:
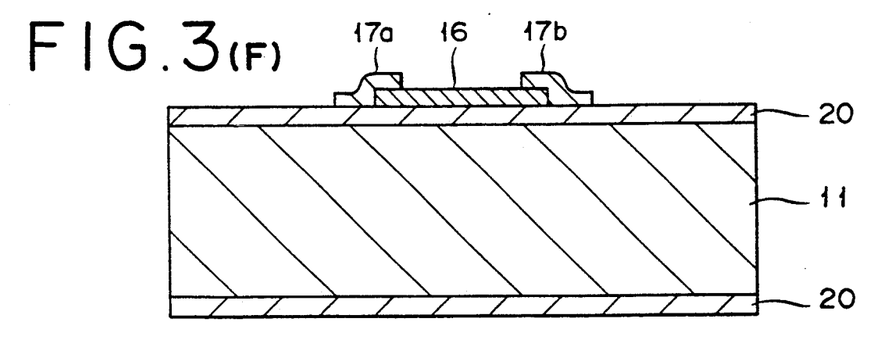

Then, as shown in FIG. 3(E), a metallic film, e.g. an aluminum film 22, was formed on the surface of the silicon substrate 11 by a vapor deposition method. Subsequently, as shown in FIG. 3(F), the aluminum film 22 was patterned by the reactive ion etching to form wirings 17a and 17b on the thermally sensitive portion 16.

Figure 3G:
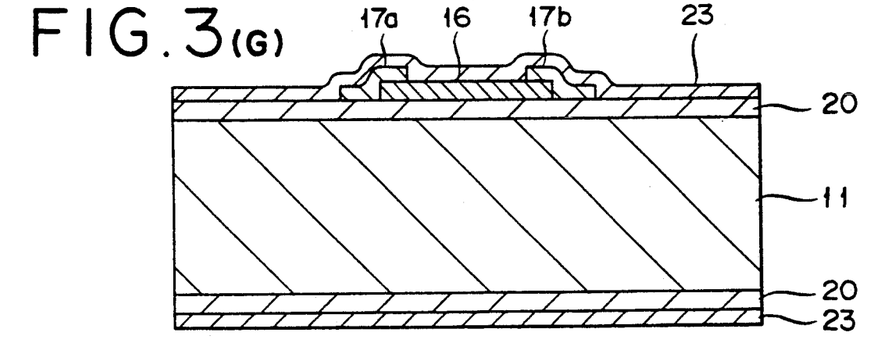

Thereafter, under the same condition as that of FIG. 3(B), a silicon oxynitride film (SiOxNy) 23 of 2 $\mu$m in thickness was formed on the surface of the silicon substrate 11 by plasma CVD method as shown in FIG. 3(G).

Figure 3H:
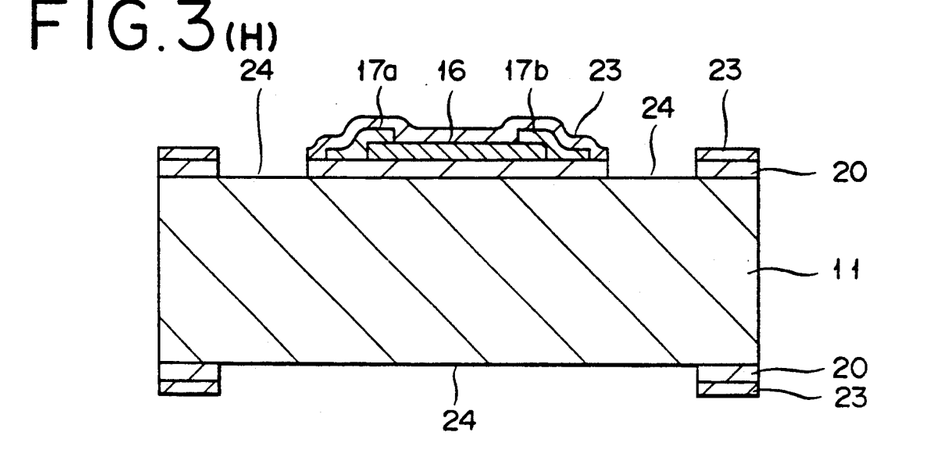

Then, the silicon oxynitride films 20 and 23 were selectively etched by the reactive ion etching to form openings 24 as shown in FIG. 3(H). In this reactive ion etching, methane trifluoride (CHF$_3$), fleon (CF$_4$) and oxygen O$_2$) were used as etching gases, the flow rates thereof were CHF$_3$=30SCCM, CF$_4$=8SCCM and O$_2$=2SCCM, the pressure for the etching was 0.075Torr, the high-frequency output was 300W and the etching time was 50 minutes. Furthermore, in the etching of the silicon oxynitride films 20 and 23, buffered hydrofluoric acid (e.g. NH$_4$F:HF=6:1) may also be used.

Figure 3I:
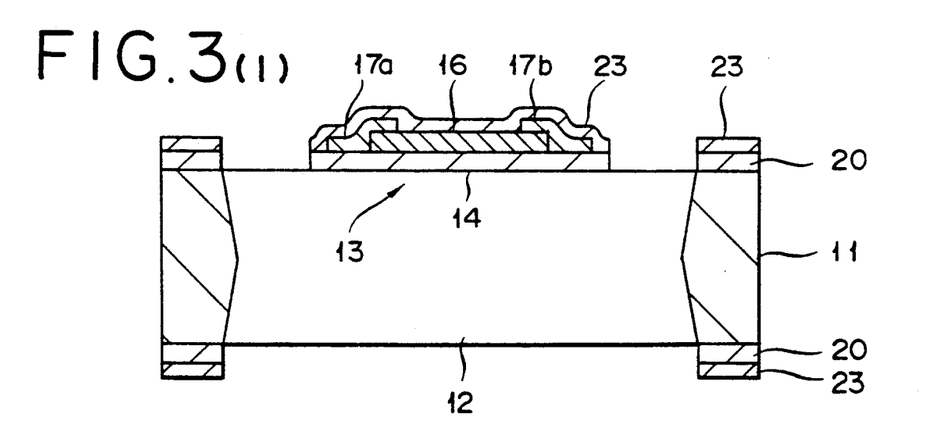

Finally, the silicon substrate 11 was etched out from both sides thereof through the openings 24 to form a caved portion 12 and a bridge portion 13 which has an infrared radiation receiving portion 14 and a supporting portions 15 as shown in FIGS. 1 and 3(I). This etching was carried out by anisotropic etching using an aqueous of hydrazine.

Figure 4:
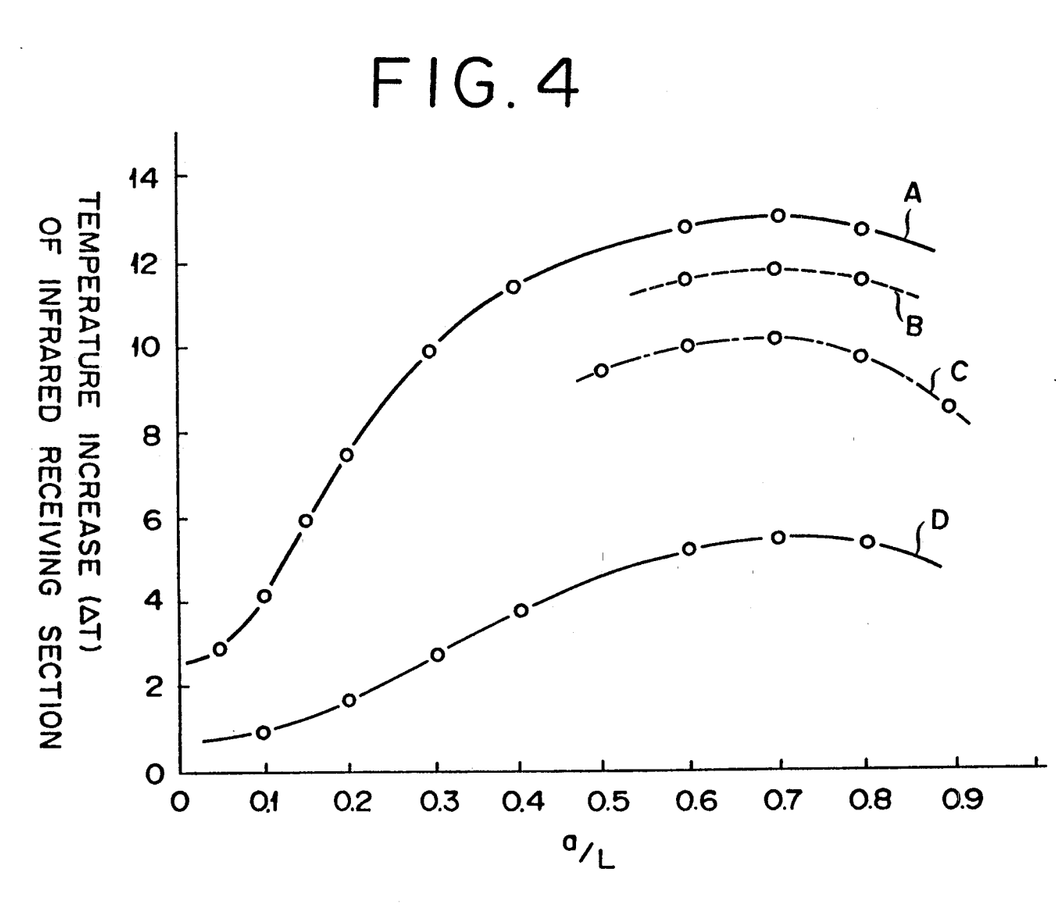
FIG. 4 is a graph showing results of computer simulation of a relationship between a/L and ΔT in the infrared radiation sensor of FIG. 1.

FIG. 4 shows a relationship between a/L and a relative value of temperature increase $\Delta T$ at the center of the infrared radiation receiving portion 14, using as parameters the width and the number of the bridge portion 13 and the infrared radiation receiving portion 14, which relationship was obtained by computer simulation on the basis of finite element method. In FIG. 4, $a$ is a diameter when the plane shape of the infrared radiation receiving portion 14 is a circle, or a length of a side when it is a square, and L is the whole length of the bridge portion 13. Furthermore, in order to simplify the calculation, the shape coefficient of each element on the bridge portion 13 was assumed to be 1. In the initial condition in the simulation model, the temperature of the whole bridge portion 13 was assumed to be 20° C., and in the boundary condition, the temperature of the silicon substrate 11, i.e. the temperature of the base end of the supporting portion 15, was assumed to be constant at 20° C. The temperature of a heat source (a subject, the temperature of which is to be measured) was assumed to be 36.5° C., and the heat source was assumed to be separated from the center of the infrared radiation receiving portion 14 by a vertical distance of 2mm. Furthermore, $\Delta T$ shows a saturated value of temperature increase of the thermally sensitive portion 16 about 10 seconds after radiation by infrared radiation.

In FIG. 4, A is the case in which the infrared radiation receiving portion 14 is a square and the number of the supporting portions 15 (35 $\mu$m in width) is two, B is the case in which the infrared radiation receiving portion 14 is a circle and the number of the supporting portions m in width) is two, C is the case in which the infrared radiation receiving portion 14 is a circle and the number of the supporting portion 15 is four (the width of the opposite two supporting portions is 40 $\mu$m and the width of the other two supporting portions is 40 $\mu$m and the width of the case in which the infrared radiation receiving portion 14 is a square and the number of the supporting portions 15 (35 $\mu$ m in width) is two. In either case of A to D, the thickness of the bridge portion 13 was assumed to be 3 $\mu$ m, and the whole length (L) of the bridge portion 13 was assumed to be 2mm in either case of A to C and 1mm in the case of D.

As can be clearly seen from FIG. 4, regardless of the width and the number of the supporting portions 15, $\Delta T$ reaches a maximum when a/L is about 0.7. When the value, of a/L is small, i.e. when the area of the infrared radiation receiving portion 14 is small, the amount of the received infrared radiation is small so that the temperature increase $\Delta T$ is also small. On the other hand,. when the value of a/L exceeds 0.7, the length of the supporting portions 15 which have a small width, i.e. a small heat conduction, is short relative to the size of the infrared radiation receiving portion 14, so that the amount of heat getting scattered and lost increases, thereby the temperature increase $\Delta T$ decreases. That is, from a relationship amount of heat lost due to heat conduction, $\Delta T$ reaches a maximum when a/L is a specific value (0.7).

As mentioned above, when the value of a/L=0.7, the value of $\Delta T$ reaches a maximum. However, By experiments by the inventors, it was found that when a/L=0.7, the supporting portion 15 tends to be damaged in the step for etching the silicon substrate 11 to form the bridge portion 13, so that the yield decreases to be about 20%.

As shown in FIG. 4, if a/L is not 0.7, e.g. if a/L=0.5, the decrease of the temperature increase $\Delta T$ is only about 8% compared with that when a/L=0.7. Therefore, it is clearly advantageous to increase the yield of the sensor by designing the sensor so as to facilitate the formation of the supporting portion 15 when a/L is less than 0.7. In the sensor described in FIG. 1, the value of a/L is 0.25. In experiments by the inventors, when 0.2<a/L<0.6, a yield greater than 95% was obtained at the final manufacturing step. That is, the shape of the bridge portion 13 should be determined in view of both of $\Delta T$ and the yield.

Figures 5A, 5B:
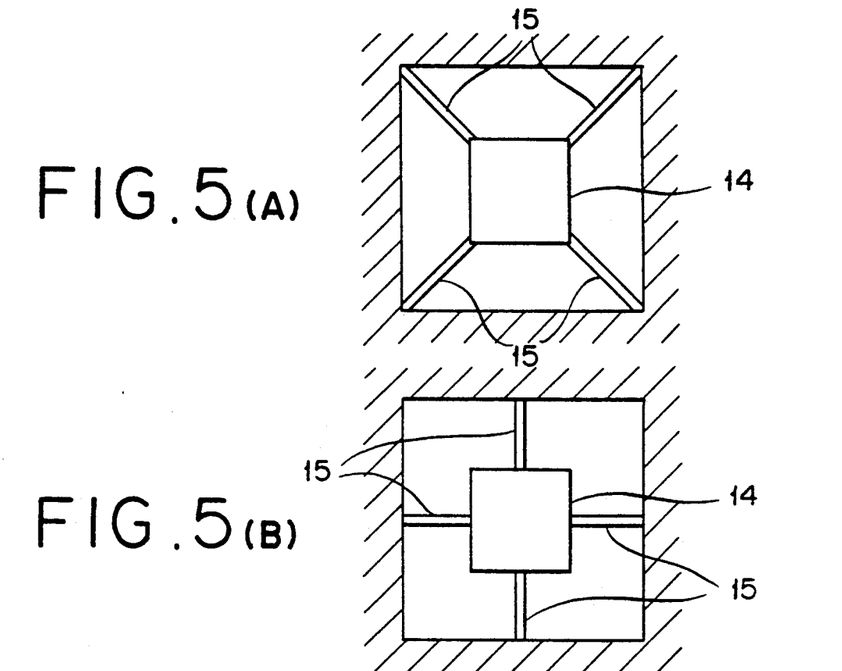
FIGS. 5(A) to (C) are plan views showing examples of a supporting structure when the shape of the infrared radiation receiving portion is substantially square.
Figure 5C:
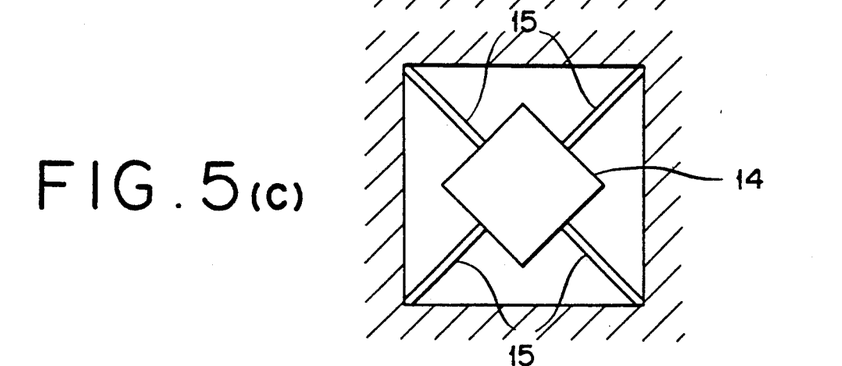

FIGS. 5(A) to (C) show examples of a plane shape of the bridge portion 13 when the infrared radiation receiving portion 14 is a square and the number of the supporting portions 15 is four. If the area of the infrared radiation receiving portion 14 is the same in either case, the value of ΔT reaches a maximum in the case of FIG. 5(C) since the length of the supporting portion 15 is the maximum in this case. However, in this case, the value of a/L is limited to be less than 0.5. In order to obtain a sensor having a/L of greater than 0.5, the sensor must have the shape shown in FIG. 5(A) or 5(B). The shape of FIG. 5(A) is better than that of FIG. 5(B) since the former can be easily formed.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims. For example, although the infrared radiation sensor (thermobolometer) utilizing thermistor effect was disclosed in the aforementioned embodiment, the present invention can be applied to other thermocouple types, p-n junction type and so forth.

What is claimed is:

1. An infrared radiation sensor comprising:
   a sensor substrate having a cave portion;
   a bridge portion formed on a surface of said sensor substrate so as to bridge said cave portion, said bridge portion comprising infrared radiation receiving portion means for receiving infrared radiation and support portion means for supporting said infrared radiation receiving portion means, said infrared radiation receiving portion means having a grater width than that of said supporting portion means; and
   thermally sensitive portion means for detecting said infrared radiation, said thermally sensitive portion means being formed on said infrared radiation receiving portion means, said thermally sensitive portion means having characteristics in which electrical resistance varies in accordance with the infrared radiation received by said infrared receiving radiation portion means.

2. An infrared radiation sensor according to claim 1, wherein said infrared radiation receiving portion is integrally formed with said supporting portions.

3. An infrared radiation sensor according to claim 1, wherein said infrared radiation receiving portion is arranged at a center of said bridge portion.

4. An infrared radiation sensor according to claim 1, wherein said infrared radiation receiving portion has a plane shape of a square having a greater side length than the width of said supporting portion means.

5. An infrared radiation sensor, comprising:
   a sensor substrate having a cave portion;
   a bridge portion formed on a surface of said sensor substrate so as to bridge said cave portion, said bridge portion comprising infrared radiation receiving portion means for receiving infrared radiation and supporting portion means for supporting said infrared radiation receiving portion means, said infrared radiation receiving portion means having a grater width than that of said supporting portion means, said infrared radiation receiving portion means having a plane shape of a square with a greater side length than the width of said supporting portion means, a ratio of said side length to a whole length of said bridge portion being in the range of 0.1 to 0.9; and
   thermally sensitive portion means for detecting said infrared radiation, said thermally sensitive portion means being formed on said infrared radiation receiving portion means, said thermally sensitive portion means having characteristics in which electrical resistance varies in accordance with the infrared radiation received by said infrared receiving radiation portion means.

6. An infrared radiation sensor according to claim 5, wherein said ratio is in the range of 0.2 to 0.6.

7. An infrared radiation sensor according to claim 1, wherein said infrared receiving portion has a plane shape of a circle having a greater diameter than the width of said supporting portions.

8. An infrared radiation sensor, comprising:
   a sensor substrate having a cave portion;
   a bridge portion formed on a surface of said sensor substrate so as to bridge said cave portion, said bridge portion comprising infrared radiation receiving portion means for receiving infrared radiation and supporting portion means for supporting said infrared radiation receiving portion means, said infrared radiation receiving portion means having a grater width than that of said supporting portion means, said infrared radiation receiving portion means having a plane shape of a circle with a greater side length than the width of said supporting portion means, a ratio of said diameter length to a whole length of said bridge portion being in the range of 0.1 to 0.9; and
   thermally sensitive portion means for detecting said infrared radiation, said thermally sensitive portion means being formed on said infrared radiation receiving portion means, said thermally sensitive portion means having characteristics in which electrical resistance varies in accordance with the infrared radiation received by said infrared receiving radiation portion means.

9. An infrared radiation sensor according to claim 8, wherein said ratio is in the range of 0.2 to 0.6.

10. An infrared radiation sensor according to cl aim 1, wherein said sensor substrate is a silicon or germanium substrate.

11. An infrared radiation sensor according to claim 10, wherein said sensor substrate is a silicon substrate.

12. An infrared radiation sensor according to claim 1, wherein said thermally sensitive portion means is formed of a film selected from the group consisting of amorphous germanium, amorphous silicon and polycrystalline silicon films.

13. An infrared radiation sensor according to claim 12, wherein said thermally sensitive portion means is formed of an amorphous germanium film.

14. An infrared radiation sensor according to claim 1, wherein said bridge portion is formed of a dielectric material selected from the group consisting of a silicon oxide film, a silicon nitride film, a laminated film thereof and a silicon oxynitride film.

15. An infrared radiations sensor according to claim 14, wherein said bridge portion is formed of a silicon oxynitride film.

16. An infrared radiations sensor according to claim 1, wherein said bridge portion is formed of a synthetic re in selected from the group consisting of polyimides and photoresists.

17. An infrared radiations sensor according to claim 1, wherein said bridge portion is formed of a semiconductor material selected from the group consisting of monocrystalline silicons and polycrystalline silicons.

18. An infrared radiation sensor according to claim 1, wherein said bridge portion is formed of a thin metallic film.

19. An infrared radiation sensor according to claim 1, which further comprises an infrared radiation guiding aperture for guiding infrared radiation to said infrared radiation receiving portion means via said cave portion.

* * * * *

UNITED STATES PATENT AND TRADEMARK OFFICE
CERTIFICATE OF CORRECTION

PATENT NO. : 5,302,933　　　　　　　　　　　　Page 1 of 2
DATED　　　 : April 12, 1994
INVENTOR(S) : Takeshi KUDO et al.

It is certified that error appears in the above-indentified patent and that said Letters Patent is hereby corrected as shown below:

Title Page, Item [56] "References Cited", under
　　　　　"FOREIGN PATENT DOCUMENTS", insert:

```
    -63-265125     11/1988    Japan
     63-273024     11/1988    Japan
      0,504,928     9/1992    European Patent Office
     WO 82/01066    4/1982    WIPO--.
```

Column 1, line 59, before "laminated" insert --a--.

Column 6, line 47, after "relationship" insert --between the--.

Column 6, line 47, after "amount" insert --of the received infrared radiation and the amount--.

Column 7, line 51 (claim 2, line 3), change "portions" to --portion means--.

UNITED STATES PATENT AND TRADEMARK OFFICE
CERTIFICATE OF CORRECTION

PATENT NO. : 5,302,933
DATED : April 12, 1994
INVENTOR(S) : Takeshi KUDO et al.

It is certified that error appears in the above-indentified patent and that said Letters Patent is hereby corrected as shown below:

Column 8, line 18 (claim 7, line 2), after "infrared" insert --radiation--.

Column 8, line 20 (claim 7, line 4), change "portions" to --portion means--.

Signed and Sealed this

Seventeenth Day of June, 1997

BRUCE LEHMAN

*Attest:*

*Attesting Officer*  *Commissioner of Patents and Trademarks*